United States Patent
Chen et al.

(10) Patent No.: US 10,034,409 B2
(45) Date of Patent: Jul. 24, 2018

(54) INDIVIDUAL FRONT HOT-PLUGGABLE POWER SUPPY UNIT WITH CABLE ROUTING

(71) Applicant: Quanta Computer Inc., Taoyuan (TW)

(72) Inventors: Chao-Jung Chen, Taoyuan (TW);
Yaw-Tzorng Tsorng, Taoyuan (TW);
Chen-Chien Kuo, Taoyuan (TW);
Chung-Kai Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/185,945

(22) Filed: Jun. 17, 2016

(65) Prior Publication Data
US 2017/0367210 A1    Dec. 21, 2017

(51) Int. Cl.
*H05K 7/14* (2006.01)
*G06F 1/26* (2006.01)
*G06F 11/20* (2006.01)

(52) U.S. Cl.
CPC ......... *H05K 7/1492* (2013.01); *H05K 7/1447* (2013.01); *G06F 1/263* (2013.01); *G06F 11/2015* (2013.01)

(58) Field of Classification Search
CPC .... H05K 7/1492; H05K 7/1411; G06F 1/263; G06F 11/2015
See application file for complete search history.

(56) References Cited

U.S. PATENT DOCUMENTS

| | | | |
|---|---|---|---|
| 6,937,461 B1* | 8/2005 | Donahue, IV | H01R 13/514 174/50 |
| 2012/0218689 A1 | 8/2012 | Peng et al. | |
| 2013/0193764 A1 | 8/2013 | Bailey et al. | |
| 2015/0117077 A1* | 4/2015 | Huang | H05K 7/1492 363/144 |
| 2016/0044819 A1* | 2/2016 | Bailey | H05K 7/1492 361/622 |

OTHER PUBLICATIONS

TW Office Action for Application No. 105124298, dated Jun. 27, 2017, w/ Office Action.
Extended European Search Report for EP Application No. 17170115.4, dated Aug. 4, 2017.

* cited by examiner

*Primary Examiner* — James Wu
(74) *Attorney, Agent, or Firm* — Nixon Peabody LLP; Eduardo J. Qyiñones; Zhou Lu

(57) ABSTRACT

Server rack assembly having a chassis and two or more power supply units configured to be received within the chassis. Each power supply unit configured to be coupled with a power distribution unit by a power cord and having an aperture formed on a front surface to receive the power cord. A chassis channel formed within the chassis to receive each power cord extending substantially the length of the chassis. Each of the two or more power supply units can be independently removable from the chassis.

12 Claims, 4 Drawing Sheets

INDIVIDUAL FRONT HOT-PLUGGABLE POWER SUPPY UNIT WITH CABLE ROUTING

TECHNICAL FIELD

The present disclosure relates to power supply units, more specifically the present disclosure relates to front access, hot swappable power supply units.

BACKGROUND

Power supply units (PSU) can be placed at the front of a chassis to provide easy access. Each PSU within a server rack assembly has a corresponding power cord coupling the respective PSU with a Power Distribution Unit (PDU) disposed at the rear of the chassis and server rack assembly. Known chassis provide internal cable routing to route power cords collectively from the rear PDU to the front PSUs; however, this prevents easy service and repair of individual PSU units.

SUMMARY OF THE INVENTION

A server rack assembly having a chassis and two or more power supply units configured to be received within the chassis. Each power supply unit can be configured to be coupled with a power distribution unit by a power cord and have an aperture formed on a front surface to receive the power cord. A chassis channel can be formed within the chassis to receive each power cord and extending substantially the length of the chassis. Each of the two or more power supply units can be independently removable from the chassis.

The server rack assembly can also have a power distribution unit disposed on an opposing end of the chassis from the two or more power supply units. The two or more power supply units can be horizontally adjacent and the chassis channel extends at least a portion of the width of the chassis. The chassis channel can be formed along a sidewall of the chassis. The chassis channel can be non-linear, vertically and horizontally displaced.

Each of the two or more power supply units can have a power supply unit channel configured to receive the respective power cord and extending from the aperture to the chassis channel. Each of the two or more power supply units is hot swappable.

BRIEF DESCRIPTION OF THE DRAWINGS

Various embodiments in accordance with the present disclosure will be described with reference to the drawings, in which.

DETAILED DESCRIPTION

Figure 1:
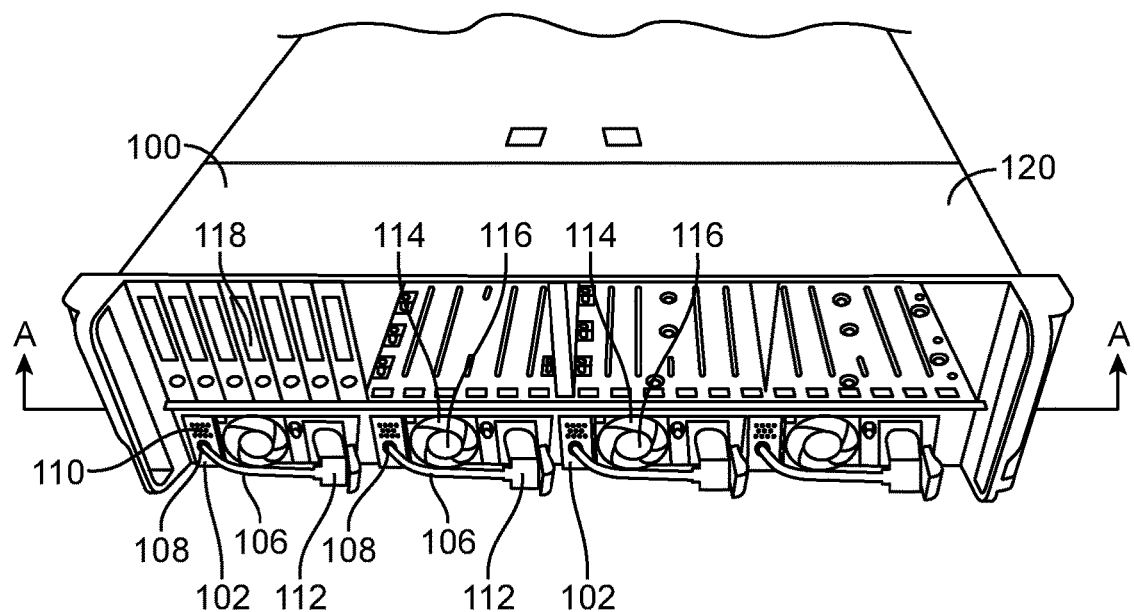
FIG. 1 is an isometric view of a chassis having at least two power supply units and configured to be received in a server rack assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure relates to a server rack assembly having a chassis and two or more power supply units (PSU) configured to be received within the chassis. Each power supply unit can be configured to be coupled with a power distribution unit (PDU) by a power cord and have an aperture formed on a front surface to receive the power cord. A chassis channel can be formed within the chassis to receive each power cord and extending substantially the length of the chassis. Each of the two or more power supply units can be independently removable from the chassis.

While the illustrated embodiment shows the chassis receiving a plurality of storage devices other electronic devices can be implemented. The chassis can be configured to receive and couple with a plurality of electronic devices including, but not limited to, storage devices, graphic controllers, computer processing units, or any other electronic device. The plurality of electronic devices can couple with the two or more PSUs to receive electrical power from the PDU.

FIG. 1 illustrates a chassis 100 configured to receive two or more power supply units (PSU) 102. Each PSU 102 is configured to be coupled with a power distribution unit (PDU) 104 (shown in FIG. 3) by a power cord 106. The PSU 102 has an aperture 108 formed in the front surface 110 to receive the power cord 106. The aperture 108 is sized appropriately so as to receive end portions of the power cord 106 which can have male or female plugs having diameters that exceed the diameter of the power cord 106 between the end portions.

Each PSU 102 can be individually and independently removable from the chassis. The two or more PSUs 102 can be aligned horizontally across the width of the chassis 100. As can be appreciated in FIG. 1, the chassis 100 has four horizontally adjacent PSUs 102, but the disclosure is not limited to four. The aperture 108 formed on the front surface 110 of each PSU allows for hot-swapping of each PSU 102 by allowing respective power cords 106 and PSUs 202 to be removed and repaired independent of each other PSUs 102.

The front surface 110 can further include a front plug 112 configured to receive and engage with one end of the power cord 106. The front surface 110 can also include a cooling fan 114 and associated cooling fan cover 116 to prevent ingestion of debris, such as tools or the inadvertent insertion of a user's fingers.

The chassis 100 is configured to receive a plurality of electronic devices 118, such as storage devices. In at least one embodiment, the storage devices are hard disk drives (HDD). In other embodiments, the storage devices are solid state drives (SSD). The plurality of electronic devices 118 couple with the chassis 100 and receive electrical power from the two or more PSUs 102. The two or more PSUs 102 within the chassis 100 can be configured to supply electrical power to individual electronic devices 118, sections of electronic devices 118, or operate a redundant PSU 102 for another PSU 102 within the chassis 100.

Figure 2:
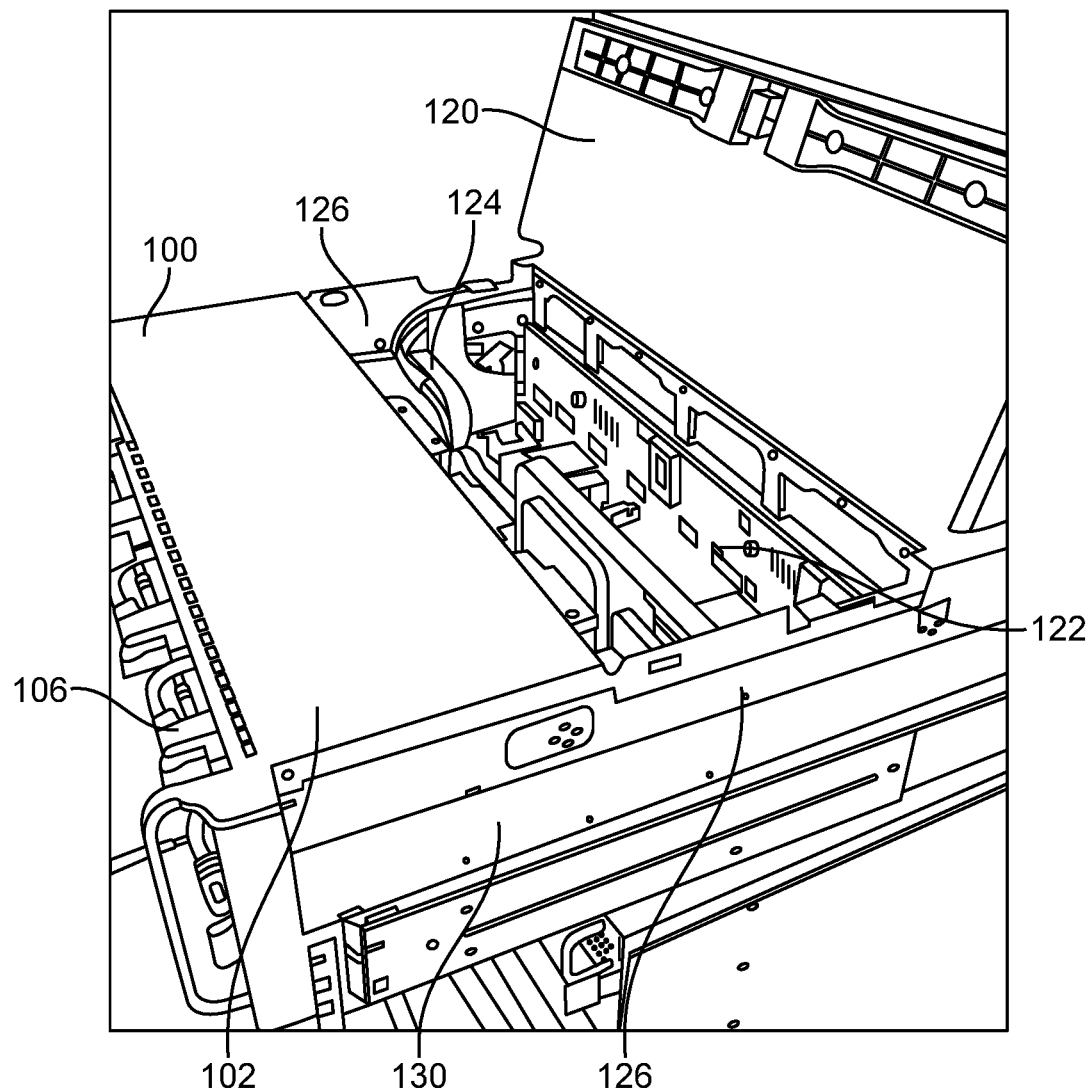
FIG. 2 is an isometric view of a chassis having an open lid.

Referring now to FIG. 2, the chassis 100 can also have a lid 120 disposed on the top surface and transitionable between a closed position and an open position In FIG. 2 the lid 120 is in the open position. The lid 120 can be transitioned to provide access to an interior portion 122 of the chassis. The chassis 100 has a chassis channel 124 formed therein to receive each power cord 106. The chassis channel 124 extends substantially the length of the chassis 100. The chassis channel 124 can also extend at least a portion of the width of the chassis 100 to accommodate horizontally adjacent PSUs 102. The chassis 100 can have rails 130 disposed on the sidewalls 126 to provide sliding engagement with a server rack assembly 200 (shown in FIG. 4). The sliding engagement allows the chassis 100 to be disposed outside of the server rack assembly without decoupling the chassis 100 from the server rack assembly 200.

A portion of the chassis channel 124 is formed along the sidewall 126 of the chassis 100. The power cord 106 is routed through the chassis channel 124 that is non-linear, such that it is vertically and horizontally displaced within the chassis.

Figure 3:
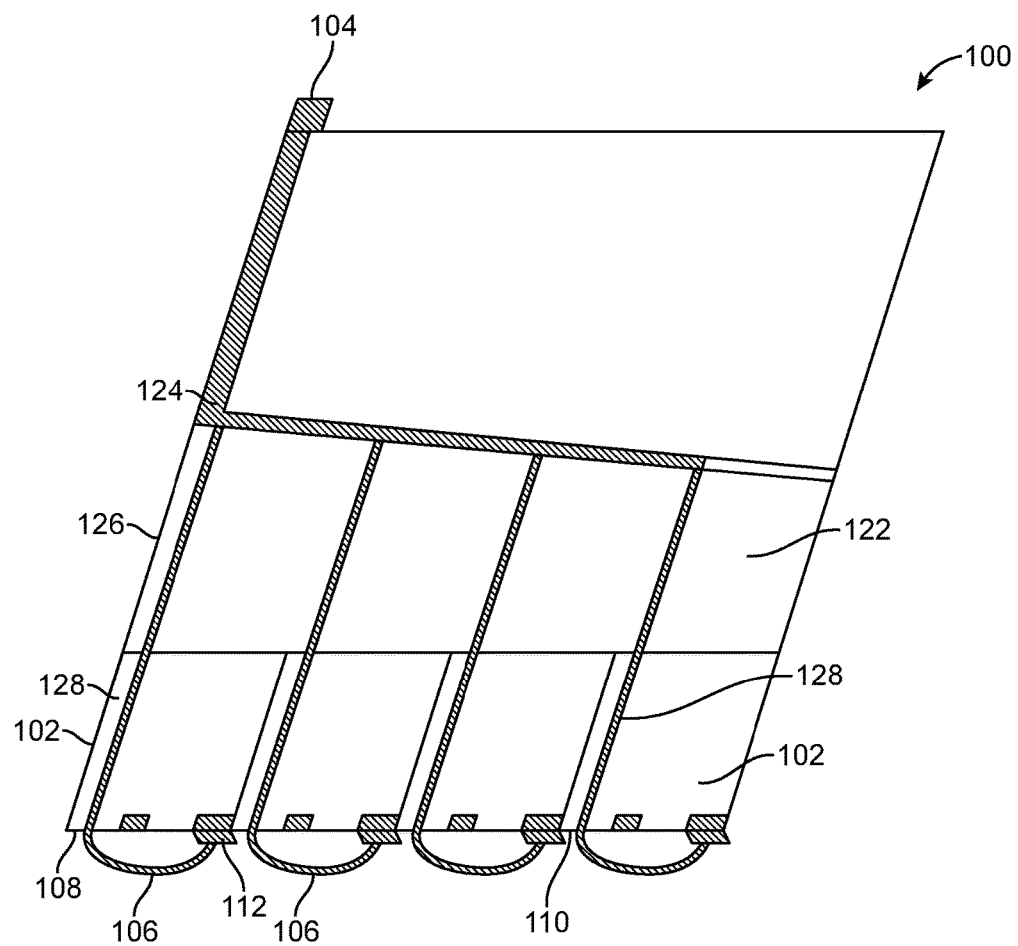
FIG. 3 is a cross section view of section A-A of FIG. 1.

FIG. 3 illustrates a cross section view of a chassis 100 having four PSUs 102 and chassis channel 124 formed therein. The chassis channel 124 extends substantially the width of the chassis 100 and a portion of the length of the chassis 100. The chassis channel 124 routes the power cord 106 rearward from the front surface 110 of the PSU 102. The chassis 100 can have a PDU 104 disposed on the opposing end from the two or more PSUs 102. As can further be appreciated in FIG. 2, the power cord 106 is routed through the chassis channel 124 that is non-linear, vertically and horizontally displaced.

Each of the two or more PSUs 102 can have a power supply unit channel 128 configured to receive the respective power cord 106. The power supply unit channel 128 extends from the aperture 108 to the chassis channel 124, thereby routing the power cord 106 from the front surface 110 of the PSU 102 to the chassis channel 124 within the chassis 100.

Figure 4:
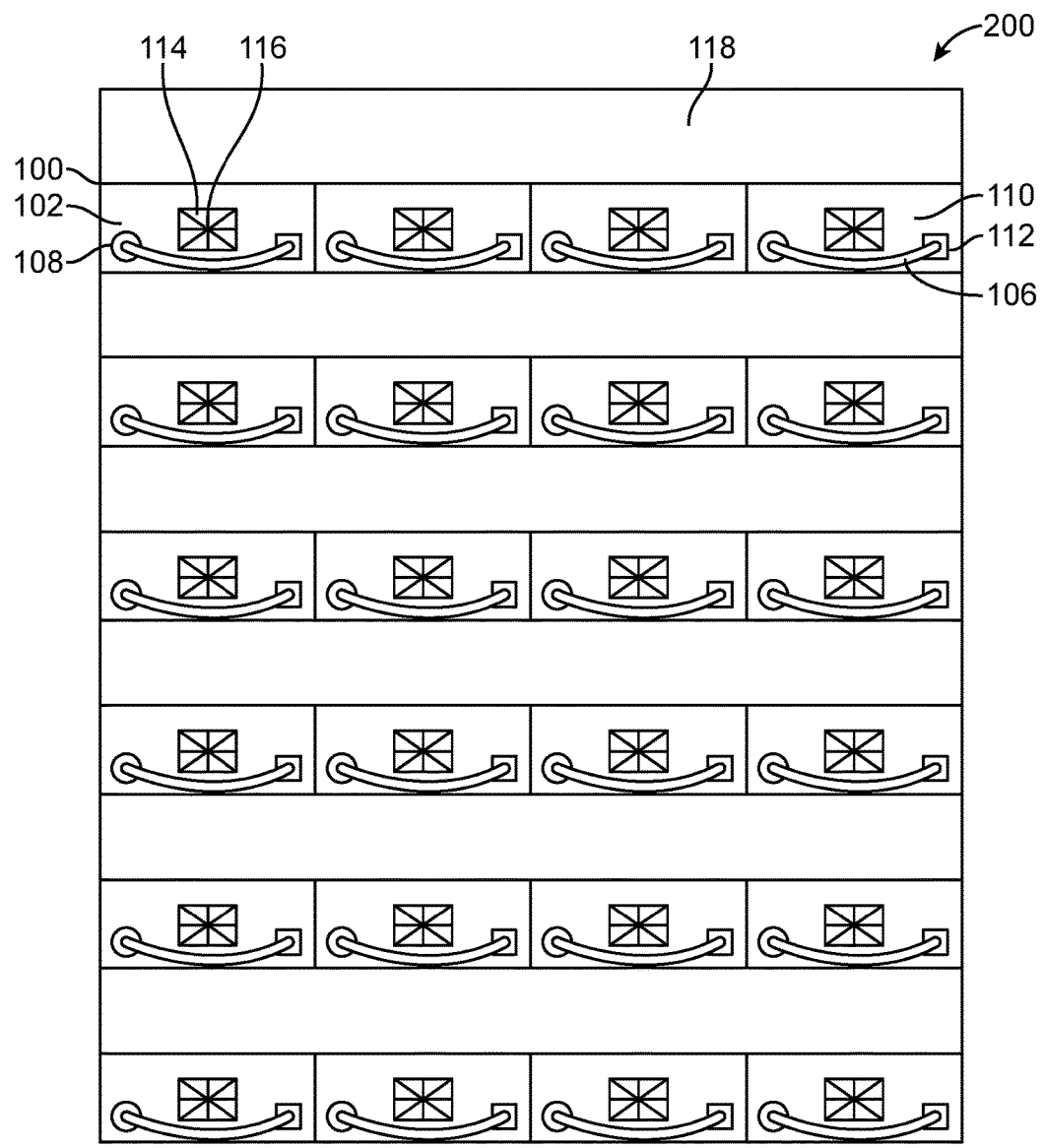
FIG. 4 is a front view of a plurality of chassis received within a server rack assembly.

FIG. 4 illustrates a front view of a server rack assembly 200 having a plurality of chassis 100 received therein. Each chassis 100 can have one or more electronic devices 118 received therein and two or more PSUs 102. As can be appreciated in FIG. 4, each chassis has four PSUs 102 horizontally adjacent one to the other. The power cord 106 of corresponding to each PSU 102 is passes through an aperture 108 formed on the front surface 110 of the PSU 102. Each chassis can be slidingly engaged with the server rack assembly 200 to allow servicing of the chassis 100 without powering down the one or more electronic devices 118.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A server rack assembly comprising:
a chassis;
a power distribution unit;
two or more power supply units configured to be received within the chassis, each power supply unit configured to be coupled with the power distribution unit by a corresponding power cord and having an aperture formed on a front surface to receive the corresponding power cord; and
a chassis channel formed within the chassis to receive each power cord, the chassis channel comprising a first portion, a second portion and a third portion, the first portion of the chassis channel being formed along a sidewall of the chassis, the first portion of the chassis channel extending substantially the length of the chassis, a width of the first portion of the chassis channel being substantially smaller than a width of the chassis, a first power supply unit having a first aperture on the front surface to receive a first power cord connected to the power distribution unit via the first portion of the chassis channel; the second portion of the chassis channel being connected to the first portion of the chassis channel, extending a substantial portion of the width of the chassis, and being vertical to the first portion of the chassis channel; the third portion of the chassis channel being connected to the second portion of the chassis channel, and vertical to the second portion of the chassis channel; a second power supply unit having a second aperture on the front surface to receive a second power cord connected to the power distribution unit via the third portion, the second portion and the first portion of the chassis channel;
wherein each of the two or more power supply units is independently removable from the chassis.

2. The server rack assembly of claim 1, wherein the power distribution unit disposed on an opposing end of the chassis from the two or more power supply units.

3. The server rack assembly of claim 1, wherein the two or more power supply units are horizontally adjacent and the chassis channel extends at least a portion of the width of the chassis.

4. The server rack assembly of claim 1, wherein the chassis channel is non-linear, vertically and horizontally displaced.

5. The server rack assembly of claim 1, wherein each of the two or more power supply units has a power supply unit channel configured to receive the respective power cord and extending from the aperture to the chassis channel.

6. The server rack assembly of claim 1, wherein each of the two or more power supply units is hot swappable.

7. An apparatus comprising:
two or more power supply units, each power supply unit configured to be coupled with a power distribution unit by a power cord and having an aperture formed on a front surface to receive the power cord;
a power distribution unit; and a channel receiving each power cord, the channel comprising a first portion, a second portion and a third portion, the first portion of the channel being formed along a sidewall of the apparatus, the first portion of the channel extending substantially the length of the apparatus, a width of the first portion of the channel being substantially smaller than a width of the apparatus, a first power supply unit having a first aperture on the front surface to receive a first power cord connected to the power distribution unit via the first portion of the channel; the second portion of the channel being connected to the first portion of the channel, extending a substantial portion of the width of the chassis, and being vertical to the first portion of the channel; the third portion of the channel being connected to the second portion of the channel, and vertical to the second portion of the channel; a second power supply unit having a second aperture on the front surface to receive a second power cord connected to the power distribution unit via the third portion, the second portion and the first portion of the channel;

wherein each of the two or more power supply units is independently removable from the apparatus.

8. The apparatus of claim 7, further comprising the power distribution unit disposed on an opposing end from the two or more power supply units.

9. The apparatus of claim 7, wherein the two or more power supply units are horizontally adjacent and the channel extends at least a portion of the width of the apparatus.

10. The apparatus of claim 7, wherein the channel is non-linear, vertically and horizontally displaced.

11. The apparatus of claim 7, wherein each of the two or more power supply units has a power supply unit channel configured to receive the respective power cord and extending from the aperture to the channel.

12. The apparatus of claim 7, wherein each of the two or more power supply units is hot swappable.

* * * * *

UNITED STATES PATENT AND TRADEMARK OFFICE
CERTIFICATE OF CORRECTION

PATENT NO. : 10,034,409 B2  
APPLICATION NO. : 15/185945  
DATED : July 24, 2018  
INVENTOR(S) : Chao-Jung Chen et al.

Page 1 of 1

It is certified that error appears in the above-identified patent and that said Letters Patent is hereby corrected as shown below:

On the Title Page

Item (54) and in the Specification Column 1, Lines 1-3 should read, --INDIVIDUAL FRONT HOT-PLUGGABLE POWER SUPPLY UNIT WITH CABLE ROUTING--

Signed and Sealed this  
Fourth Day of August, 2020

Andrei Iancu  
*Director of the United States Patent and Trademark Office*